(12) United States Patent
Asai et al.

(10) Patent No.: US 6,376,906 B1
(45) Date of Patent: *Apr. 23, 2002

(54) MOUNTING STRUCTURE OF SEMICONDUCTOR ELEMENT

(75) Inventors: Yasutomi Asai; Shinji Ota, both of Okazaki; Takashi Nagasaka, Anjo, all of (JP)

(73) Assignee: Denso Corporation, Kariya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/021,989

(22) Filed: Feb. 11, 1998

(30) Foreign Application Priority Data

Feb. 12, 1997 (JP) .............................. 9-028087

(51) Int. Cl.$^7$ .............................. H01L 23/04
(52) U.S. Cl. ...................... 257/698; 257/700
(58) Field of Search ........................ 257/698

(56) References Cited

U.S. PATENT DOCUMENTS

| | | | |
|---|---|---|---|
| 4,560,826 A | * 12/1985 | Burns et al. ............. | 174/52 FP |
| 5,397,864 A | 3/1995 | Rai et al. | |
| 5,400,950 A | 3/1995 | Myers et al. | |
| 5,627,344 A | 5/1997 | Tanituji et al. | |
| 5,635,761 A | * 6/1997 | Cao et al. ................. | 257/700 |
| 5,654,590 A | 8/1997 | Kuramochi | |
| 5,710,695 A | * 1/1998 | Manteghi .................. | 361/813 |
| 5,886,877 A | 3/1999 | Shingai et al. | |
| 5,891,754 A | * 4/1999 | Bowles et al. ............. | 438/108 |

FOREIGN PATENT DOCUMENTS

| | | |
|---|---|---|
| JP | 4-84494 | 3/1992 |
| JP | 4-118958 | 4/1992 |
| JP | 4-363877 | 12/1992 |
| JP | 5-37160 | 2/1993 |
| JP | 5-102249 | 4/1993 |
| JP | 5-243330 | 9/1993 |
| JP | 7-106464 | 4/1995 |
| JP | 7-273243 | 10/1995 |
| JP | 7-326835 | 12/1995 |
| JP | 8-008300 | 1/1996 |
| JP | 10-308582 | 11/1998 |

OTHER PUBLICATIONS

Journal of Nippondenso Technical Disclosure No. 57–149.

* cited by examiner

Primary Examiner—Olik Chaudhuri
Assistant Examiner—Douglas A. Wille
(74) Attorney, Agent, or Firm—Pillsbury Winthrop LLP

(57) ABSTRACT

In a mounting structure of a flip chip IC, the flip chip IC is mounted on an alumina laminated substrate through conductive lands of the substrate and bumps of the flip chip IC. A space between the flip chip IC and the substrate is filled with resin. Further, inspection lands are provided on the substrate for inspecting the flip chip IC, and are electrically connected to the conductive lands through vias and inside wires provided in the substrate. That is, the inspection lands are connected to the conductive lands to bypath an edge portion of the resin. As a result, separation of the resin from the substrate can be prevented.

42 Claims, 4 Drawing Sheets

MOUNTING STRUCTURE OF SEMICONDUCTOR ELEMENT

CROSS REFERENCE TO RELATED APPLICATION

This application is based upon and claims the benefit of priority of the prior Japanese Patent Application No. 9-28087 filed on Feb. 12, 1997, the contents of which are incorporated herein by reference.

BACKGROUND OF THE INVENTION

1. Field of the Invention:

The present invention relates to a mounting structure of a semiconductor element such as a flip chip IC, which is mounted on an insulation substrate.

2. Related Arts:

FIG. 1A shows a conventional structure of a ceramic laminated substrate 1 made of alumina (referred to as an alumina laminated substrate) and a flip chip IC 7 mounted on the alumina laminated substrate. The alumina laminated substrate 1 has via holes 2 (referred to as vias) filled with conductive material and inside wires 3 provided therein. Further, conductive lands 4 are provided on the surface of the alumina laminated substrate 1 and are connected to the vias 2. The flip chip IC 7 has solder bumps 8, and is joined to the alumina laminated substrate 1 by aligning the solder bumps 8 with the conductive lands 4.

In this case, due to a difference in thermal expansion coefficient between the flip chip 7 and the substrate 1, the larger the size of the flip chip IC 7 becomes, the larger thermal distortion of the solder bumps 8 becomes. Therefore, reinforcement resin 9 is injected into a space between the flip chip IC 7 and the substrate 1 in order to prevent the distortion of the bumps 8. In addition, inspection lands 6 for inspecting the flip chip IC 7 are disposed on the surface of the substrate 1 and are connected to the conductive lands 4 through wiring members 5 made of conductive material as shown in FIG. 1B.

During thermal testing of the above-mentioned mounting structure, separation of the reinforcement resin 9 from the substrate 1 started from a joining portion between an edge portion A (herebelow referred to as a fillet portion) of the reinforcement resin 9 around the flip chip 7 and the wiring members 5. Then, the separation progressed inside of the joining portion. As a result, the reinforcement resin 9 did not sufficiently reinforce the solder bumps 8, so that cracks were produced in the solder bumps 8. It is assumed that the reason why the separation started from the joining portion between the fillet portion A of the reinforcement resin 9 and the wiring members 5 is because the adhesive strength between the reinforcement resin 9 and the wiring members 5 is significantly small compared to that between the reinforcement resin 9 and the alumina laminated substrate 1.

This kind of problem is not limited to the above-mentioned mounting structure of the flip chip IC 7, and may occur to the other mounting structures. For example, when a bare chip like a semiconductor element is mounted on an insulation substrate through wires, the wires are generally connected to bonding pads (wire lands) provided on the substrate. The semiconductor element is sealed with sealing resin. Even in this structure, a wiring pattern for connecting inspection lands and the wire lands is provided on the surface of the substrate, so that there arises a similar problem that the sealing resin is separated from the wiring pattern. Consequently, the wires are opened.

SUMMARY OF THE INVENTION

The present invention has been made in view of the above-mentioned problems and an objective of the present invention is to provide a mounting structure of a semiconductor element mounted on an insulation substrate with resin interposed therebetween without producing separation of the resin from the substrate. More specifically, the object of the present invention is to prevent the separation of the resin from the substrate on a wiring member for an inspection land.

In a mounting structure according to the present invention, a semiconductor element is mounted on an insulation substrate through a conductive land disposed on the insulation substrate. A resin member is then disposed around the semiconductor element and the conductive land on the insulation substrate. Further, an inspection land is disposed on an outside of the resin member on the insulation substrate, and is connected to the conductive land through an inside wire provided in the insulation substrate so as to bypass the resin member. In this structure, there is no wiring pattern for the inspection land on the insulation substrate. The inside wire connecting the inspection land and the conductive land does not contact the resin member. Therefore, avoiding separating the resin member from the insulation substrate.

The semiconductor element may have a bump and can be mounted on the insulation substrate through the bump and the conductive land which are electrically connected to each other. In this case, the resin member is disposed in a space between the semiconductor element and the insulation substrate. The semiconductor element may be connected to the conductive land through a wire. In this case, the resin member covers the semiconductor element and the wire. The insulation substrate may be a laminated substrate having a via.

BRIEF DESCRIPTION OF THE DRAWINGS

These and other objects and features of the present invention will become more readily apparent from a better understanding of preferred embodiments described below with reference to the following drawings.

DETAILED DESCRIPTION OF THE PREFERRED EMBODIMENTS

Figure 1A:
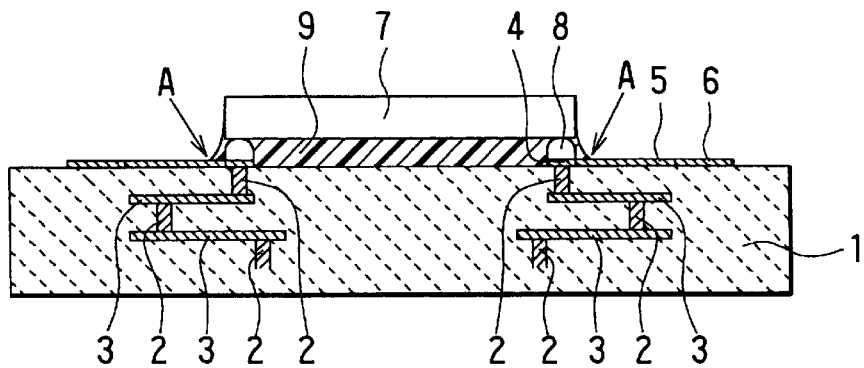
FIG. 1A shows a cross-sectional view showing a mounting structure of a flip chip IC according to a prior art.
Figure 1B:
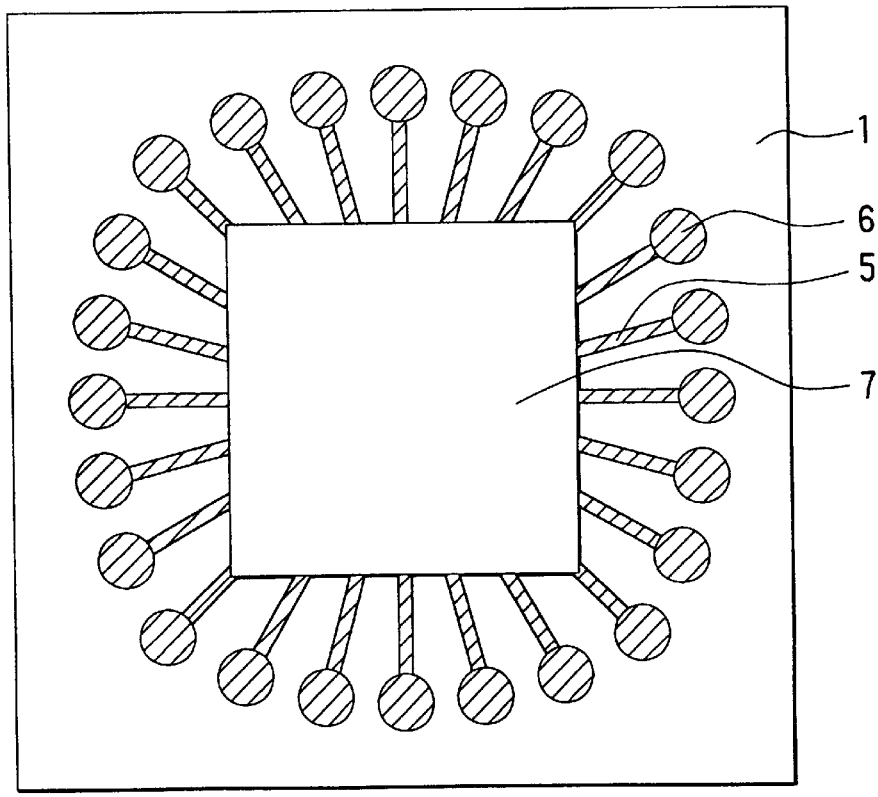
FIG. 1B is a plan view showing the mounting structure of the flip chip IC shown in FIG. 1.

In embodiments, the parts and components similar to those in the prior art shown in FIGS. 1A and 1B are shown by the same reference numerals and similar descriptions thereof will be simplified.

Figure 2A:
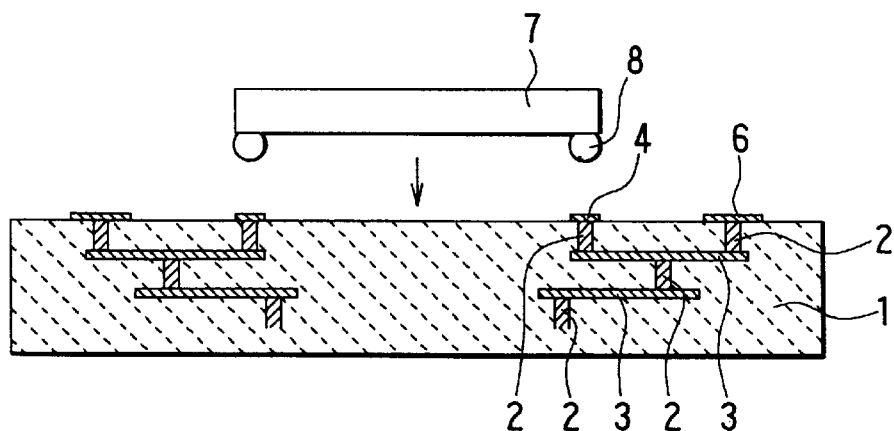
FIG. 2A is a cross-sectional view showing an alumina laminated substrate and a flip chip IC before mounted on the substrate in a first preferred embodiment of the present invention.
Figure 2B:
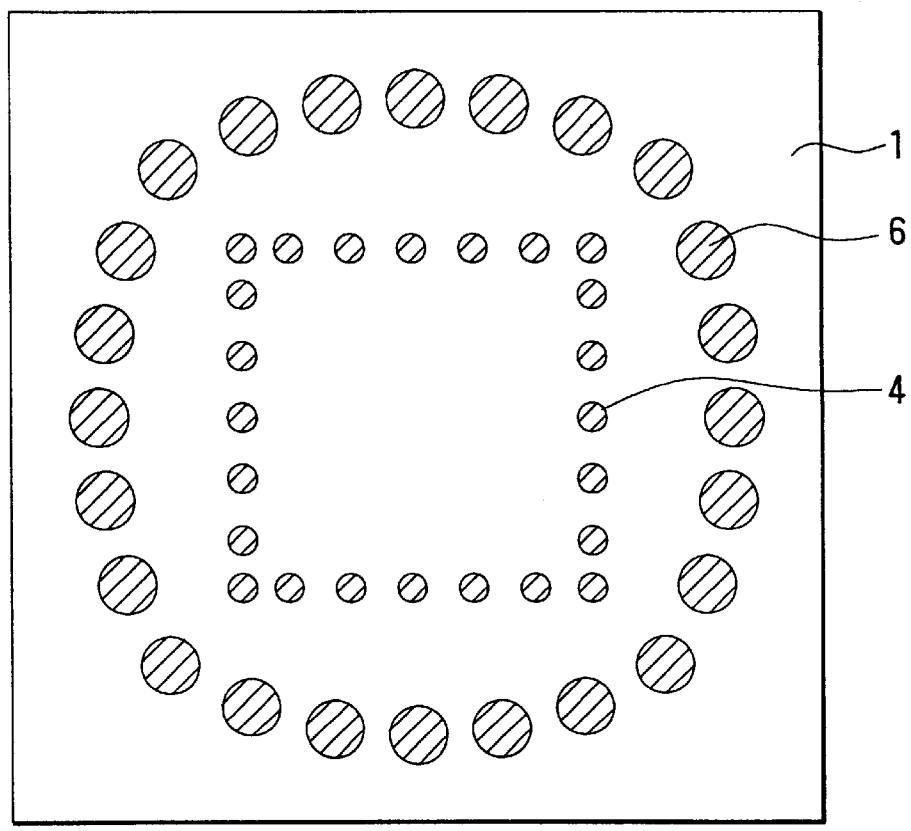
FIG. 2B is a plan view showing the alumina laminated substrate before mounting the flip chip IC thereon in the first embodiment.

As shown in FIGS. 2A and 2B, an alumina laminated substrate 1 in a first preferred embodiment has wiring patterns composed of vias 2 and inside wires 3 therein. Further, conductive lands 4 and inspection lands 6 are disposed on the surface of the alumina laminated substrate 1 and respectively connected to the vias 2. The vias 2 and the inside wires 3 provided in the alumina laminated substrate 1 electrically connect various electronic parts mounted on the alumina laminated substrate 1, and simultaneously electrically connect the conductive lands 4 and the inspection lands 6. The electronic parts include a semiconductor element, a capacitor, a resistor, and the like. The conductive lands 4 and the inspection lands 6 are made of materials including copper, silver, nickel, gold, platinum, palladium, or tin as a main material.

Figure 3A:
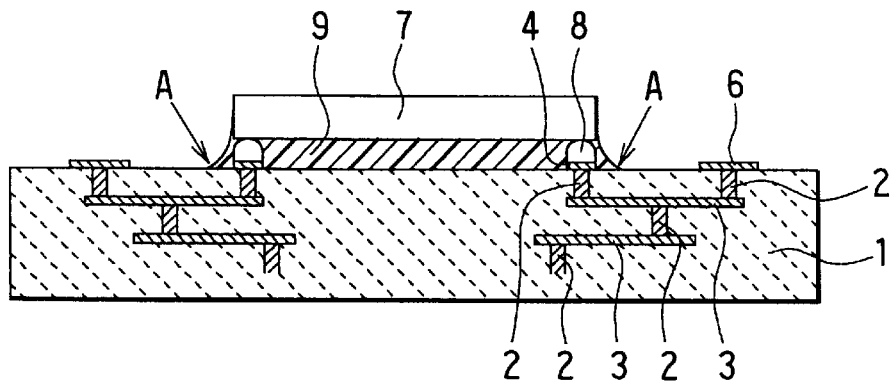
FIG. 3A is a cross-sectional view showing a mounting structure of the flip chip IC and the alumina laminated substrate in the first embodiment.
Figure 3B:
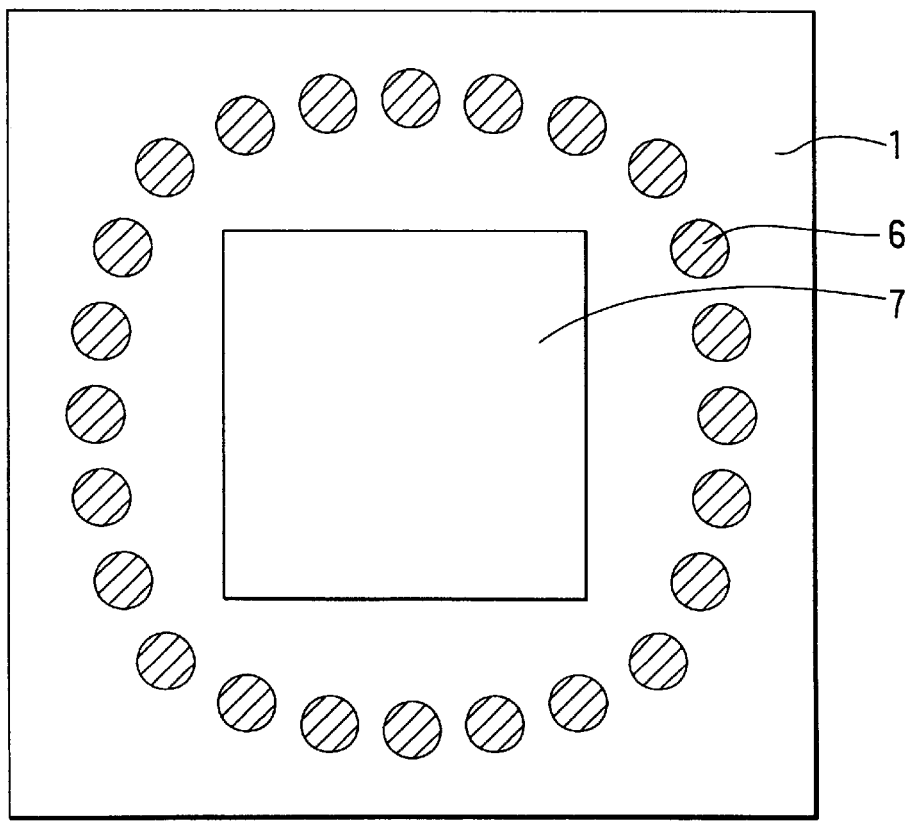
FIG. 3B is a plan view showing the mounting structure of the flip chip IC and the alumina laminated substrate in the first embodiment.

A flip chip IC 7 has solder bumps 8 formed on electrodes thereof. As shown in FIG. 2A, the solder bumps 8 are positioned with respect to the conductive lands 4, and the flip chip IC 7 is mounted on the alumina laminated substrate 1 by fusing the solder bumps 8. Then, as shown in FIG. 3A, reinforcement resin 9 is injected into a space between the flip chip IC 7 and the alumina laminated substrate 1. An epoxy system resin including glass filler of 70 wt % can be used as the reinforcement resin 9. The plan view of the thus formed mounting structure is shown in FIG. 3B.

In the above-mentioned mounting structure, the inspection lands 6 are electrically connected to the conductive lands 4 through the vias 2 and the inside wires 3 provided in the alumina laminated substrate 1. That is, the wiring structure of the inspection lands 6 and the conductive lands 4 bypass the fillet portion A of the reinforcement resin 9. Accordingly, the fillet portion A of the reinforcement resin 9 does not contact wiring members of the inspection lands 6. The fillet portion A of the reinforcement resin 9 only contacts the alumina laminated substrate to have large adhesive strength. As a result, the reinforcement resin 9 does not separate from the alumina laminated substrate 1 even under thermal cycles, stress such as moisture, and the like.

Figure 4:
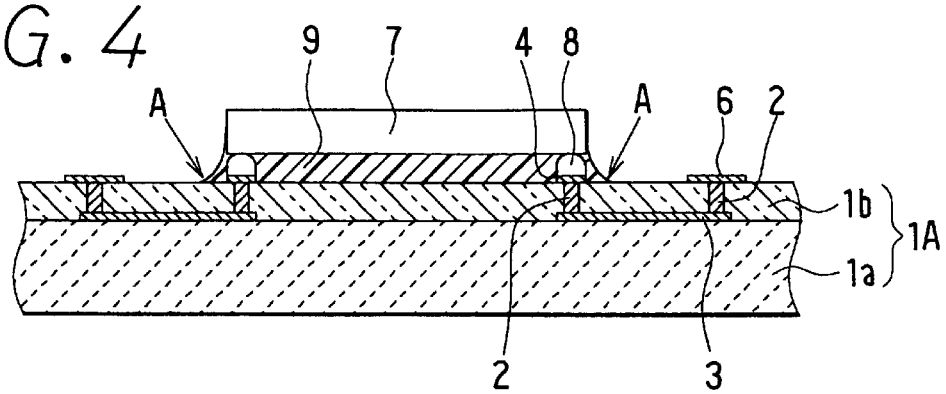
FIG. 4 is a cross-sectional view showing a mounting structure of the flip chip and a printed multi-layer substrate in the first embodiment.

Although the alumina laminated substrate 1 is employed as an insulation substrate in this embodiment, another laminated substrate baked at a lower temperature may be used as the insulation substrate. The insulation substrate may be a printed multi-layer substrate 1A shown in FIG. 4 including an alumina substrate 1a and an insulation glass member 1b disposed on the alumina substrate 1a. In this case, because the adhesive strength between the reinforcement resin 9 and the insulation glass member 1b is large, the same effect as mentioned above can be obtained. The insulation substrate may be a single layer substrate. In this case, vias are formed to penetrate the substrate, and conducive lands formed on the surface of the substrate are electrically connected to the inspection lands formed on the other surface of the substrate through the vias and wiring members.

Figure 5:
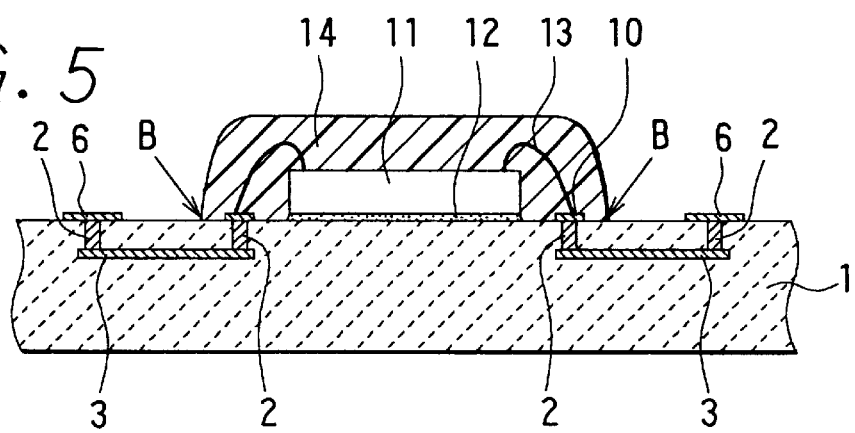
FIG. 5 is a cross-sectional view showing a mounting structure of a semiconductor bare chip and a substrate in a second preferred embodiment.

In a second preferred embodiment, a semiconductor bare chip 11 is mounted on the alumina laminated substrate 1 as shown in FIG. 5. The alumina laminated substrate 1 has the vias 2 and the inside wires 3 therein to form inside wiring patterns as in the first embodiment. The alumina laminated substrate 1 further has wire lands 10 and the detection lands 6 that are respectively connected to the vias 2. The semiconductor bare chip 11 is bonded to the alumina laminated substrate 1 by adhesives 12 including, for example, epoxy resin and silver filler. Then, wire bonding is performed to electrodes of the semiconductor bare chip 11 and the wire lands 10 by using wires 13 made of gold, aluminum, or the like. Then, the semiconductor bare chip 11 is sealed with sealing resin 14 including epoxy system resin or the like. The wire lands 10 can be made of conductive materials such as copper, aluminum, gold, silver, or the like.

In the second embodiment, the inspection lands 6 are electrically connected to the wire lands 10 through the vias 2 and the inside wires 3 as in the first embodiment. Therefore, the wiring structure in the second embodiment bypaths an edge portion B of the sealing resin 14 as well. As a result, the edge portion B of the sealing resin 14 only contacts the alumina laminated substrate to have sufficient adhesive strength. Consequently, separation of the sealing resin 14 from the alumina laminated substrate 1 can be prevented even under thermal cycles, stress such as moisture, or the like.

Figure 6A:
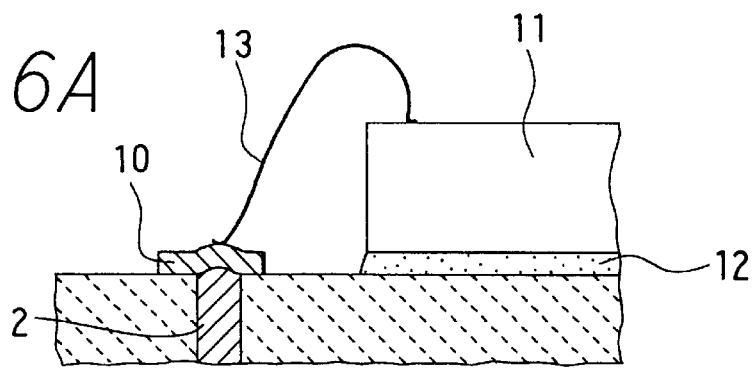
FIGS. 6A and 6B are cross-sectional views for explaining a position where a wire land is to be provided on a via in the second embodiment.
Figure 6B:
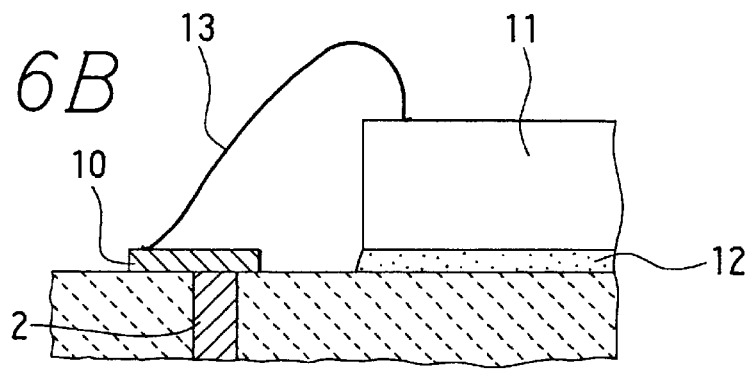

In the second embodiment, when the wires 13 are respectively bonded to the wire lands 10, it is difficult for the wires 13 to be bonded on the wire lands 10 just above the vias 2. This is because, as shown in FIG. 6A, surface roughness of each of the wire lands 10 just above the vias 2 is relatively large. Therefore, it is preferable that the wires 13 are bonded to the wire lands 10 not to be just above the vias 2 as shown in FIG. 6B. To bond the wires 13 in such a manner, it is preferable that the conductive lands 10 are formed on the vias 2 such that each center of the conductive lands 10 is shifted from each center of the vias 2.

In the second embodiment, a laminated substrate baked at a low temperature, a single layer substrate, a printed multi-layer substrate, or the like can be used as the insulation substrate in place of the alumina laminated substrate 1 as well. In the first and second embodiments, it is not always necessary that the number of the inspection lands 6 is equal to that of the conductive lands 4 or 10. The number of the inspection lands 6 can be determined based on a number of terminals used for an inspection.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A mounting structure of a semiconductor element, comprising:
   a substrate having a substrate main surface;
   a first land disposed on the substrate main surface;
   a semiconductor chip having an electrode and mounted on the substrate main surface with the electrode electrically connected to the first land;
   a resin member hermetically sealing the semiconductor chip and the first land in contact with the substrate main surface;
   a second land disposed on the substrate main surface apart from an edge portion of the resin member on the substrate main surface;
   first and second via-conductors provided vertically in the substrate, each of the via-conductors being located under a corresponding one of the first and second lands; and an inside-wire provided laterally within a thickness of the substrate and not being exposed to an outer surface of the substrate, the inside-wire being connected to the first and second via-conductors, wherein:

the semiconductor chip is sealed only by the resin member; and the first land is electrically connected to the second land via the first and second via-conductors and the inside-wire while bypassing the edge portion of the resin member.

2. The mounting structure of claim 1, further comprising a wire electrically connecting the electrode of the semiconductor chip and the first land, wherein the resin member hermetically seals the semiconductor chip, the first land, and the wire.

3. The mounting structure of claim 1, further comprising a third via-conductor extending vertically in the substrate, from a wiring node provided at a middle of the inside-wire, wherein an entirety of the third via-conductor is contained in the substrate and connected to another inside-wire in the substrate.

4. The mounting structure of claim 1, wherein the second land has a size larger than that of the first land.

5. The mounting structure of claim 4, wherein:

the first land is composed of a first plurality of lands;

the second land is composed of a second plurality of lands corresponding to the first plurality of lands, respectively; and all of the second plurality of lands are larger than the first plurality of lands in size.

6. The mounting structure of claim 1, wherein:

the first land is composed of a first plurality of lands;

the second land is composed of a second plurality of lands; and the inside-wire is composed of a plurality of inside-wires respectively connecting corresponding ones of the first plurality of lands and the second plurality of lands, wherein all of the plurality of inside-wires are provided inside the substrate at an approximately identical depth with one another from the substrate main surface.

7. The mounting structure of claim 6, wherein:

the substrate is composed of a plurality of laminated layers that includes an uppermost layer forming the substrate main surface; and the plurality of inside-wires underlie the uppermost layer.

8. The mounting structure of claim 1, wherein:

the first land is composed of a first plurality of lands;

the second land is composed of a second plurality of lands equal in number to that of the first plurality of lands;

the inside-wire is composed of a plurality of inside-wires respectively provided in the substrate and each connecting a corresponding one of the first plurality of lands and a corresponding one of the second plurality of lands; and the substrate main surface has no land between the corresponding one of the first plurality of lands and the corresponding one of the second plurality of lands.

9. The mounting structure of claim 1, wherein:

the substrate is a laminated substrate having the first and second via-conductors and the inside-wire; and the inside-wire is sandwiched between two sintered insulating material layers of the laminated substrate.

10. The mounting structure of claim 1, wherein the first land is disposed on the first via-conductor with a center of the first land shifted from a center of the first via-conductor.

11. The mounting structure of claim 1, wherein:

the first land has a plurality of first land portions;

the second land has a plurality of second land portions equal in number to that of the plurality of first land portions; and each of the plurality of first land portions is connected to a corresponding one of the plurality of second land portions while bypassing the edge portion of the resin member.

12. The mounting structure of claim 1, wherein the substrate has a surface portion which forms the substrate main surface and is made of one of alumina and glass.

13. The mounting structure of claim 1, wherein the resin member contains an epoxy resin.

14. The mounting structure of claim 13, wherein the resin member contains a filler.

15. The mounting structure of claim 14, wherein the filler is made of glass.

16. The mounting structure of claim 1, wherein the first land and the second land contain at least one selected from a group consisting of copper, silver, nickel, gold, platinum, palladium, tin, and aluminum.

17. The mounting structure of claim 1, wherein the resin member has a bottom face contacting the substrate main surface, and an externally exposed outer surface.

18. The mounting structure of claim 17, wherein the edge portion of the resin member is defined by the bottom face and the outer surface of the resin member.

19. The mounting structure of claim 1, wherein both the first land and the second land are disposed on the substrate main surface apart from the edge portion of the resin member.

20. The mounting structure of claim 1, wherein the resin member contains glass.

21. A mounting structure of a semiconductor element, comprising:

a substrate having a substrate main surface;

a first land disposed on the substrate main surface;

a semiconductor chip mounted on the substrate main surface and electrically connected to the first land at an electrical connection part;

a resin member hermetically sealing at least the electrical connection part between the first land and the semiconductor chip in contact with the substrate main surface;

a second land disposed on the substrate main surface apart from an edge portion of the resin member on the substrate main surface;

first and second via-conductors provided vertically in the substrate, each of the via-conductors being located under a corresponding one of the first and second lands; and an inside-wire provided laterally within a thickness of the substrate and not being exposed to an outer surface of the substrate, the inside-wire being connected to the first and second via-conductors, wherein:

the edge portion of the resin member is exposed externally; and the first land is electrically connected to the second land via the first and second via-conductors and the inside-wire while bypassing the edge portion of the resin member.

22. The mounting structure of claim 21, further comprising a bump disposed between the semiconductor chip and the first land and electrically connecting the semiconductor chip and the first land at the electrical connection part.

23. The mounting structure of claim 21, wherein a member that is directly disposed on the substrate main surface and simultaneously contacts the resin member is the first land exclusively.

24. The mounting structure of claim 21, further comprising a third via-conductor extending vertically in the substrate, from a wiring node provided at a middle of the inside-wire, wherein an entirety of the third via-conductor is contained in the substrate and connected to another inside-wire in the substrate.

25. The mounting structure of claim 24, wherein the second land has a size larger than that of the first land.

26. The mounting structure of claim 25, wherein:

the first land is composed of a first plurality of lands;

the second land is composed of a second plurality of lands corresponding to the first plurality of lands, respectively; and all of the second plurality of lands are larger than the first plurality of lands in size.

27. The mounting structure of claim 21, wherein:

the first land is composed of a first plurality of lands;

the second land is composed of a second plurality of lands; and the inside-wire is composed of a plurality of inside-wires respectively connecting corresponding ones of the first plurality of lands and the second plurality of lands, wherein;

all of the plurality of inside-wires are provided inside the substrate at an approximately identical depth with one another from the substrate main surface.

28. The mounting structure of claim 27, wherein:

the substrate is composed of a plurality of laminated layers that includes an uppermost layer forming the substrate main surface; and the plurality of inside-wires underlie the uppermost layer.

29. The mounting structure of claim 21, wherein:

the first land is composed of a first plurality of lands;

the second land is composed of a second plurality of lands equal in number to that of the first plurality of lands;

the inside-wire is composed of a plurality of inside-wires respectively provided in the substrate and each connecting a corresponding one of the first plurality of lands and a corresponding one of the second plurality of lands; and the substrate main surface has no land between the corresponding one of the first plurality of lands and the corresponding one of the second plurality of lands.

30. The mounting structure of claim 21, wherein:

the substrate is a laminated substrate containing the first and second via-conductors and the inside-wire; and the inside-wire is sandwiched between two sintered insulating material layers of the laminated substrate.

31. The mounting structure of claim 21, wherein the first land is disposed on the first via-conductor with a center of the first land shifted from a center of the first via-conductor.

32. The mounting structure of claim 21, wherein:

the first land has a plurality of first land portions;

the second land has a plurality of second land portions equal in number to that of the plurality of first land portions; and each of the plurality of first land portions is connected to a corresponding one of the plurality of second land portions while bypassing the edge portion of the resin member.

33. The mounting structure of claim 21, wherein the substrate has a surface portion which forms the substrate main surface and is made of one of alumina and glass.

34. The mounting structure of claim 21, wherein the resin member contains an epoxy resin.

35. The mounting structure of claim 34, wherein the resin member contains a filler.

36. The mounting structure of claim 35, wherein the filler is made of glass.

37. The mounting structure of claim 21, wherein the first land and the second land contains at least one selected from a group consisting of copper, silver, nickel, gold, platinum, palladium, tin, and aluminum.

38. The mounting structure of claim 21, wherein the resin member has a bottom face contacting the substrate main surface, and an externally exposed outer surface.

39. The mounting structure of claim 38, wherein the edge portion of the resin member exposed externally is defined by the bottom face and the outer surface of the resin member.

40. The mounting structure of claim 21, wherein both the first land and the second land are disposed on the substrate main surface apart from the edge portion of the resin member.

41. The mounting structure of claim 21, wherein the resin member contains glass.

42. The mounting structure of claim 21, wherein the resin member is positioned between the semiconductor and the substrate.

* * * * *